(12) United States Patent
Kuri et al.

(10) Patent No.: US 8,225,169 B2
(45) Date of Patent: Jul. 17, 2012

(54) RADIO COMMUNICATION APPARATUS AND ERROR DETECTING ENCODING METHOD

(75) Inventors: Kenichi Kuri, Kanagawa (JP); Isamu Yoshii, Kanagawa (JP); Akihiko Nishio, Kanagawa (JP); Masaru Fukuoka, Ishikawa (JP)

(73) Assignee: Panasonic Corporation, Osaka (JP)

( * ) Notice: Subject to any disclaimer, the term of this patent is extended or adjusted under 35 U.S.C. 154(b) by 720 days.

(21) Appl. No.: 12/438,679

(22) PCT Filed: Aug. 24, 2007

(86) PCT No.: PCT/JP2007/066444
§ 371 (c)(1),
(2), (4) Date: Feb. 24, 2009

(87) PCT Pub. No.: WO2008/023790
PCT Pub. Date: Feb. 28, 2008

(65) Prior Publication Data
US 2010/0241934 A1    Sep. 23, 2010

(30) Foreign Application Priority Data

Aug. 25, 2006 (JP) .................. 2006-229810

(51) Int. Cl.
*H03M 13/00* (2006.01)
(52) U.S. Cl. ...................................... 714/755; 714/785
(58) Field of Classification Search .................. None
See application file for complete search history.

(56) References Cited

U.S. PATENT DOCUMENTS

| | | | |
|---|---|---|---|
| 6,651,211 B1 | 11/2003 | Abe | |
| 7,103,825 B2 * | 9/2006 | Yedidia et al. | 714/760 |
| 7,184,486 B1 * | 2/2007 | Wu et al. | 375/262 |
| 2003/0152158 A1 * | 8/2003 | Torres et al. | 375/265 |
| 2004/0187066 A1 | 9/2004 | Ichihara | |
| 2005/0044475 A1 * | 2/2005 | Yedidia et al. | 714/801 |
| 2009/0187811 A1 * | 7/2009 | Eroz et al. | 714/782 |

FOREIGN PATENT DOCUMENTS

| | | |
|---|---|---|
| JP | 09-046321 | 2/1997 |
| JP | 2000-004171 | 1/2000 |
| JP | 2004-253017 | 9/2004 |
| JP | 2005-039585 | 2/2005 |
| JP | 2006-60695 | 3/2006 |

OTHER PUBLICATIONS

European Search Report dated Jun. 22, 2010.
X. Yang, et al., "New Research on Unequal Error Protection (UEP) Property of Irregular LDPC Codes," IEEE Consumer Communications and Networking Conference, Jan. 2004, pp. 361-363.

(Continued)

*Primary Examiner* — Guerrier Merant
(74) *Attorney, Agent, or Firm* — Dickinson Wright PLLC (57) ABSTRACT

A wireless communication device is provided to make it possible to detect errors with high accuracy while to suppress reduction in throughput in the case that an LDPC (Low-Density Parity-Check) code is used for an error correcting code. In the wireless communication device, a CRC (Cyclic Redundancy Check) coding unit (101) for carrying out a CRC coding of a part of a transmitting bit sequence in accordance with a row weight of an examination matrix of the LDPC code, an LDPC coding unit (102) for carrying out the LDPC coding and generating LDPC coding data by using the same examination matrix as used for the LDPC coding carried out in the CRC coding unit (101).

12 Claims, 8 Drawing Sheets

OTHER PUBLICATIONS

S. Gounai, et al., "Lowering Error Floors of Irregular LDPC Code on Fast Fading Environment with and without Perfect CSI," IEEE Vehicular Technology Conference, vol. 1, May 2005, pp. 634-638.

Y. Kwon, et al., "A New LDPC Decoding Algorithm Aided by Segmented CRCs for Erasure Channels," IEEE Vehicular Technology Conference, vol. 1, May 2005, pp. 705-708.

M. Luby, et al., "Improved Low-Density Parity-Check Codes Using Irregular Graphs," IEEE Transactions on Information Theory, vol. 47 No. 2, Feb. 2001, pp. 585-598.

J. Hou, et al., "Performance Analysis and Code Optimization of Low Density Parity-Check Codes on Rayleigh Fading Channels," IEEE Journal on Selected Areas in Communications, vol. 19 No. 5, May 2001, pp. 924-934.

International Search Report dated Oct. 23, 2007.

3GPP TSG RAN WG1 #43, R1-051383, Seoul, Korea, Nov. 7-Nov. 11, 2005, Source: Mitsubishi Electric Corporation, NTT DoCoMo, Title:Rate-compatible LDPC codes with low complexity encoder & decoder Agenda Item: 8.6, Document for: Discussion/Decision, 23 pages total.

H. Futaki, et al., "Low-density parity-check (LDPC) coded OFDM systems," Graduate Sch. of Sci. & Technol., Sci. Univ. of Tokyo, Chiba, Japan; Vehicular Technology Conference, 2001. VTC 2001 Fall. IEEE VTS 54th, vol. 1, Jul. 2001, pp. 79-84.

Japanese Office Action dated Jan. 4, 2012.

\* cited by examiner

RADIO COMMUNICATION APPARATUS AND ERROR DETECTING ENCODING METHOD

TECHNICAL FIELD

The present invention relates to a radio communication apparatus and error detecting encoding method.

BACKGROUND ART

Since third-generation mobile communication services began, up till now, multimedia communication such as data communication and video communication has been gaining popularity. Consequently, data sizes are expected to increase even more in the future, and growing demands for higher data rates for mobile communication services are also anticipated.

Therefore, in ITU-R (International Telecommunication Union Radio Communication Sector), to realize high speed transmission of 1 Gbps in the downlink, the fourth-generation mobile communication system called IMT-Advanced is studied.

As error correcting codes to realize such high speed transmission, an LDPC (Low-Density Parity-Check) code attracts attentions (see Non-Patent Document 1). Use of an LDPC code as an error correcting code enables decoding processing to be parallelized, so that it is possible to make decoding processing faster than a turbo code whereby decoding processing needs to be performed serially and iteratively.

Further, a rate-compatible LDPC code is studied whereby a single encoder or single decoder can support a plurality of coding rates (Non-Patent Document 2).

On the other hand, when ARQ (Automatic Repeat Request) is applied to mobile communication, a radio communication apparatus on the data receiving side reports an error detecting result of received data, namely, ACK (acknowledgement) or NACK (negative acknowledgement) to a radio communication apparatus on the data transmitting side.

Here, as an error detecting method upon using an LDPC code as an error correcting code, there are cases where (1) an error detecting code such as a CRC (Cyclic Redundancy Check) code is used and where (2) a syndrome value is utilized. A syndrome value refers to a vector value generated by multiplying a parity check matrix for LDPC code and hard-decision value (decoded bit sequence) of received data, and is a parameter showing a degree of error of the received data. In error detecting utilizing syndrome values, when all the syndrome values are zero, the received data is determined not to have error and ACK is reported, and, when any syndrome value is not zero, the received data is determined to have error and NACK is reported.

Non-Patent Document 1: Low-Density Parity-Check (LDPC) Coded OFDM Systems—Coding/Decoding Over Time and Frequency Domains—, Hisashi FUTAKI and Tomoaki OHTSUKI, THE INSTITUTE OF ELECTRONICS, INFORMATION AND COMMUNICATION ENGINEERS, TECHNICAL REPORT OF IEICE, NS2001-91, RCS2001-92, pp. 79-84, 2001-07

Non-Patent Document 2: R1-051383, "Rate-compatible LDPC codes with low complexity & decoder", Mitsubishi Electric Corporation, NTT DoCoMo, 3GPP TSG-RAN WG1 #43 Meeting, 2005/11

DISCLOSURE OF INVENTION

Problem to be Solved by the Invention

Here, LDPC encoded data generated from LDPC codes is comprised of systematic bits and parity bits.

When an LDPC code is used as an error correcting code and an error detecting method using an error detecting code is adopted, the error detecting code targets only systematic bits, so that a radio communication apparatus on the data receiving side can perform an error detecting only with respect to the systematic bits after error correcting decoding, and therefore perform an error detecting accurately. However, the error detecting code is a redundancy bit and is consequently a cause of reduced throughput. Particularly, when a code block size (i.e., transmission bit sequence length) is small, the error detecting code is a major cause of reduced throughput.

On the other hand, when an LDPC code is used as an error correcting code and an error detecting method utilizing syndrome values is adopted, an error detecting code is unnecessary, so that it is possible to prevent reduction of throughput. Further, a radio communication apparatus on the data receiving side can perform error correcting decoding and error detecting at the same time, thereby increasing the processing efficiency. However, decoding processing is performed for an LDPC code using both systematic bits and parity bits, and, consequently, when an error detecting method utilizing syndrome values is adopted, it is not possible to perform an error detecting only with respect to systematic bits. Therefore, in the situation where parity bits have error yet systematic bits have no errors, that is, in the situation where retransmissions are not necessary, a NACK is reported to a radio communication apparatus on the data transmitting side and extra retransmission occurs. As a result, throughput is reduced.

It is therefore an object of the present invention to provide a radio communication apparatus and detecting encoding method for suppressing reduction of throughput and performing error detecting accurately.

Means for Solving the Problem

The radio communication apparatus of the present invention employs a configuration having: a first encoding section that acquires first encoded data by performing error detecting encoding only with respect to bits having smaller column degree in a parity check matrix for low density parity check encoding than a threshold, in a transmission bit sequence; a second encoding section that acquires second encoded data by performing the low density parity check encoding using the parity check matrix with respect to the first encoded data; and a transmitting section that transmits the second encoded data.

Advantageous Effect of the Invention

According to the present invention, when an LDPC code is used as an error correcting code, it is possible to suppress reduction of throughput and perform an error detecting accurately.

BEST MODE FOR CARRYING OUT THE INVENTION

An embodiment of the present invention will be explained below in detail with reference to the accompanying drawings.

Figure 1:
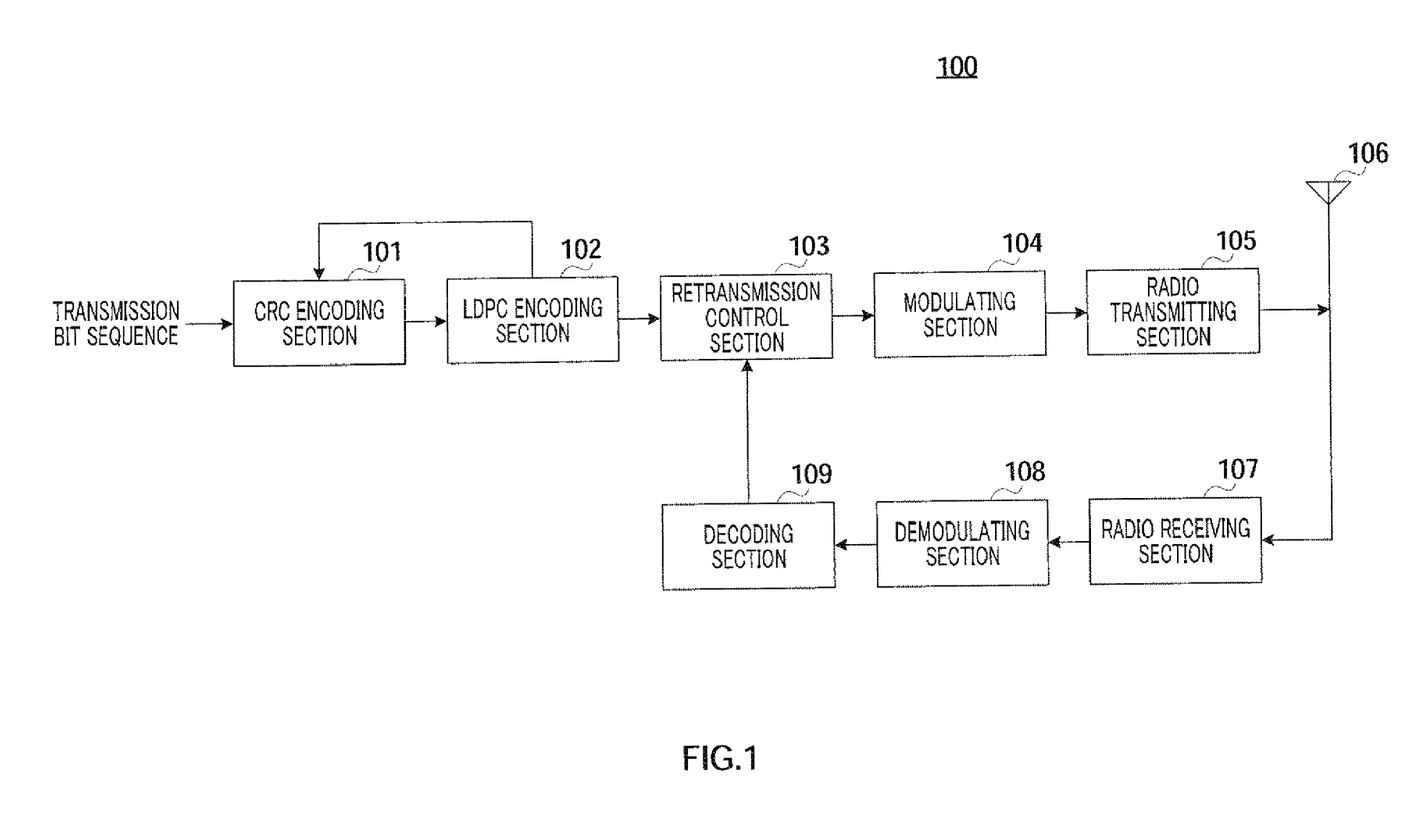
FIG. 1 is a block diagram showing a radio communication apparatus on the data transmitting side, according to an embodiment of the present invention.

FIG. 1 shows the configuration of radio communication apparatus 100 on the data transmitting side according to the present embodiment.

In radio communication apparatus 100 on the data transmitting side, CRC encoding section 101 receives as input a transmission bit sequence in units of a code block size. Further, CRC encoding section 101 receives as input column degree in a parity check matrix for LDPC code (hereinafter simply "parity check matrix") from LDPC encoding section 102. Further, based on the column degree in the parity check matrix, CRC encoding section 101 performs CRC encoding only with respect to part of the transmission bit sequence to acquire CRC encoded data. This CRC encoded data is outputted to LDPC encoding section 102. Further, CRC encoding processing in CRC encoding section 101 will be described later in detail.

LDPC encoding section 102 performs LDPC encoding with respect to the CRC encoded data to acquire LDPC encoded data, using the same parity check matrix as the parity check matrix used in the CRC encoding in CRC encoding section 101. This LDPC encoded data is outputted to retransmission control section 103.

Retransmission control section 103 outputs the LDPC encoded data as is, to modulating section 104, and keeps the data for a predetermined period. Further, upon receiving as input an ACK from decoding section 109, retransmission control section 103 discards the LDPC encoded data associated with the ACK. By contrast, upon receiving as input a NACK from decoding section 109, retransmission control section 103 outputs part of the LDPC encoded data associated with the NACK to modulating section 104 again. Thus, ARQ is applied to LDPC encoded data.

Modulating section 104 generates data symbols by modulating the LDPC encoded data, and outputs the data symbols to radio transmitting section 105.

Radio transmitting section 105 performs transmission processing such as D/A conversion, amplification and up-conversion on the data symbols, and outputs the results to the radio communication apparatus on the data receiving side from antenna 106.

On the other hand, radio receiving section 107 receives a control signal transmitted from the radio communication apparatus on the data receiving side via antenna 106, performs receiving processing such as down-conversion and A/D conversion on the control signal, and outputs the result to demodulating section 108. This control signal includes an ACK or NACK reported from the radio communication apparatus on the data receiving side.

Demodulating section 108 demodulates the control signal and outputs the result to decoding section 109.

Decoding section 109 decodes the control signal and outputs the ACK or MACK included in the control signal to retransmission control section 103.

Next, CRC encoding processing in CRC encoding section 101 will be explained in detail.

Figure 2:
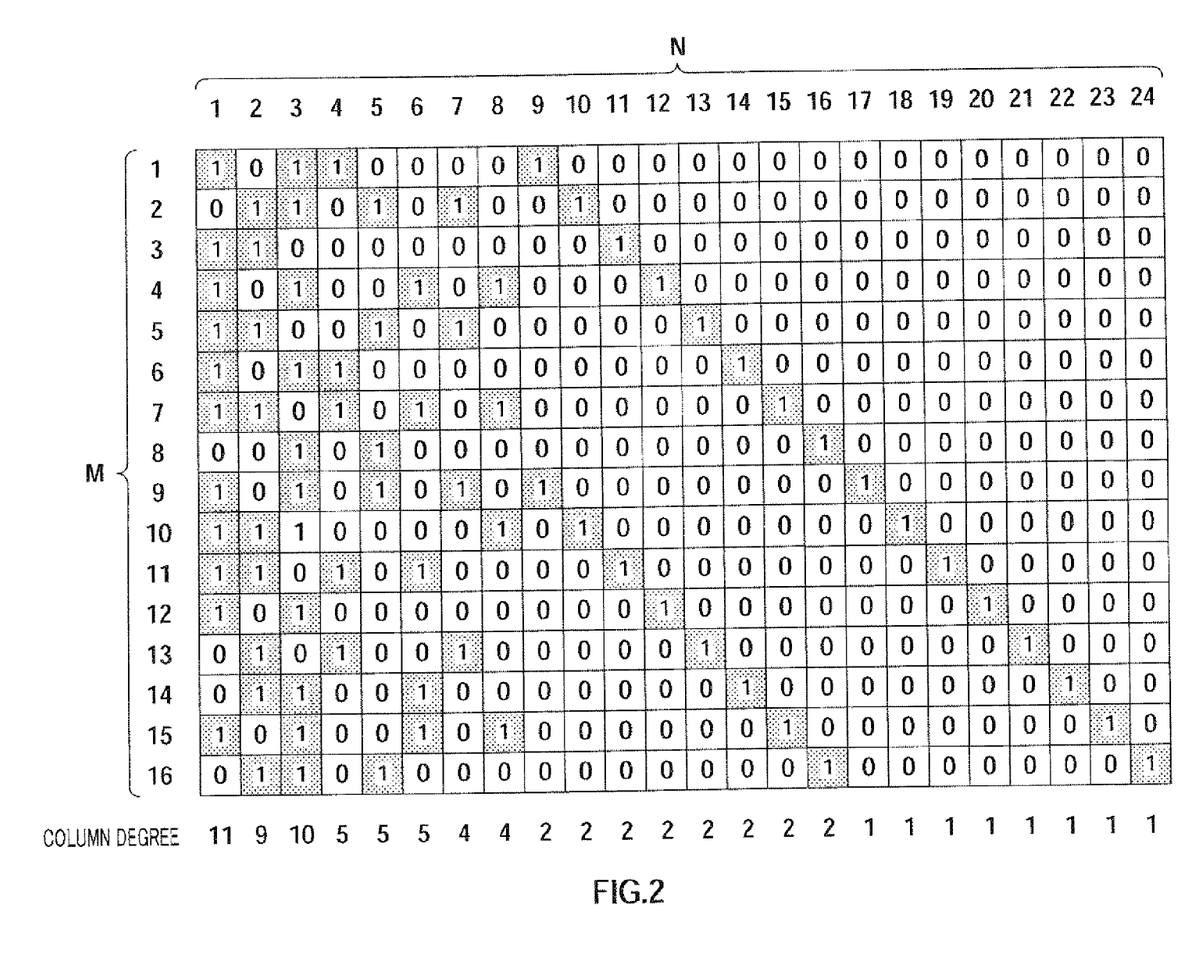
FIG. 2 illustrates a parity check matrix according to an embodiment of the present invention.

FIG. 2 illustrates an example of a parity check matrix of 16 rows and 24 columns. Thus, a parity check matrix is represented by a matrix of M rows and N columns, comprised of "1's" and "0's."

Further, the columns in the parity check matrix are associated with the bits of LDPC encoded data. That is, when LDPC encoding is performed using the parity check matrix shown in FIG. 2, 24-bit LDPC encoded data is acquired.

Further, the number of "1's" included in each column in the parity check matrix is referred to as "column degree." Therefore, in the parity check matrix shown in FIG. 2, the column degree of the first column is eleven and the column degree of the second column is nine. The same applies to the third column to the twenty-fourth column.

Figure 3:
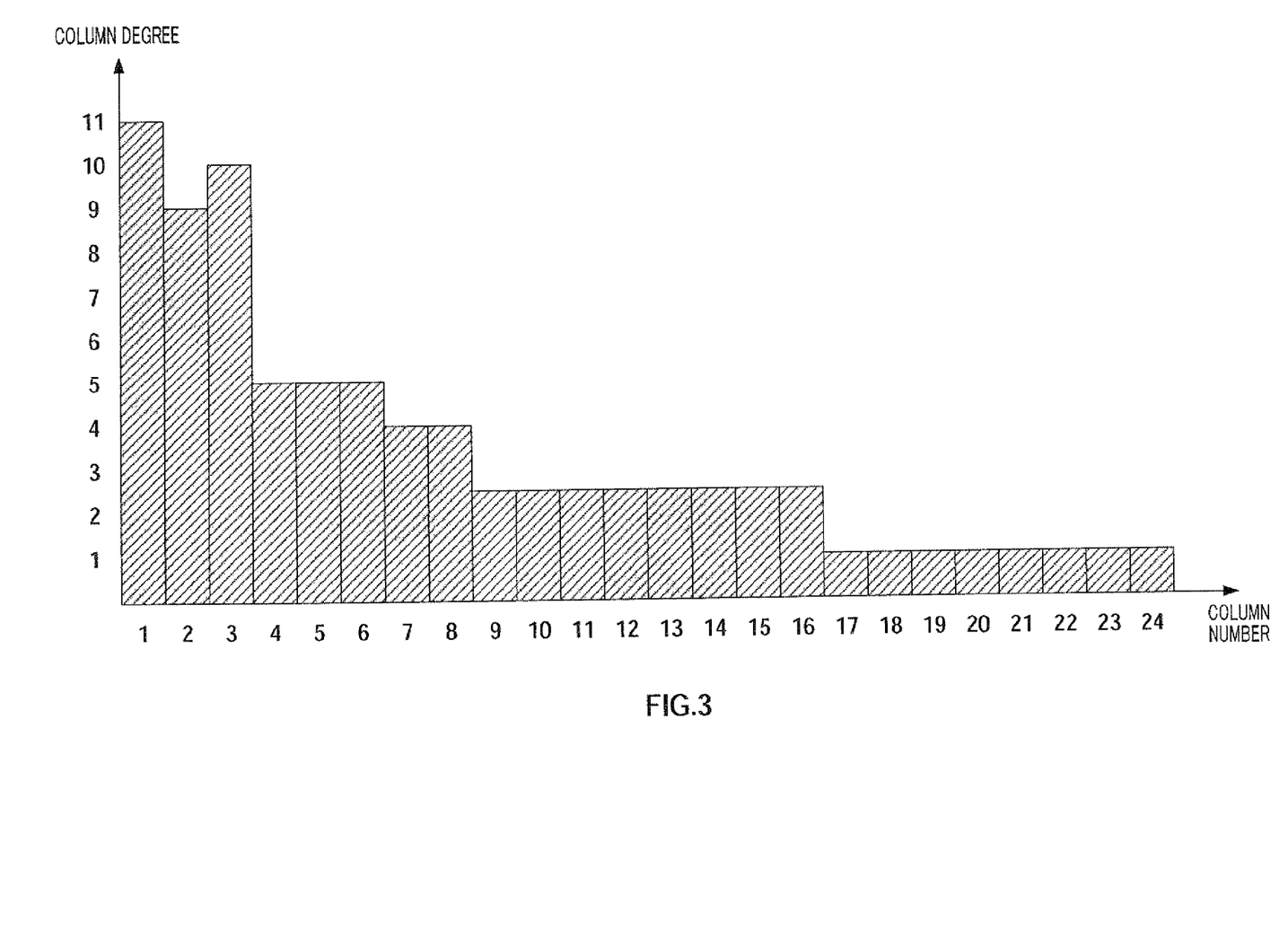
FIG. 3 illustrates a distribution of column degree in a parity check matrix according to an embodiment of the present invention.

Therefore, the distribution of column degree in the parity check matrix of FIG. 2 is as shown in FIG. 3. That is, in the 24-bit LDPC encoded data, the column degree for the first bit is eleven and the column degree for the second bit is nine. The same applies to the third bit to the twenty-fourth bit.

Figure 4:
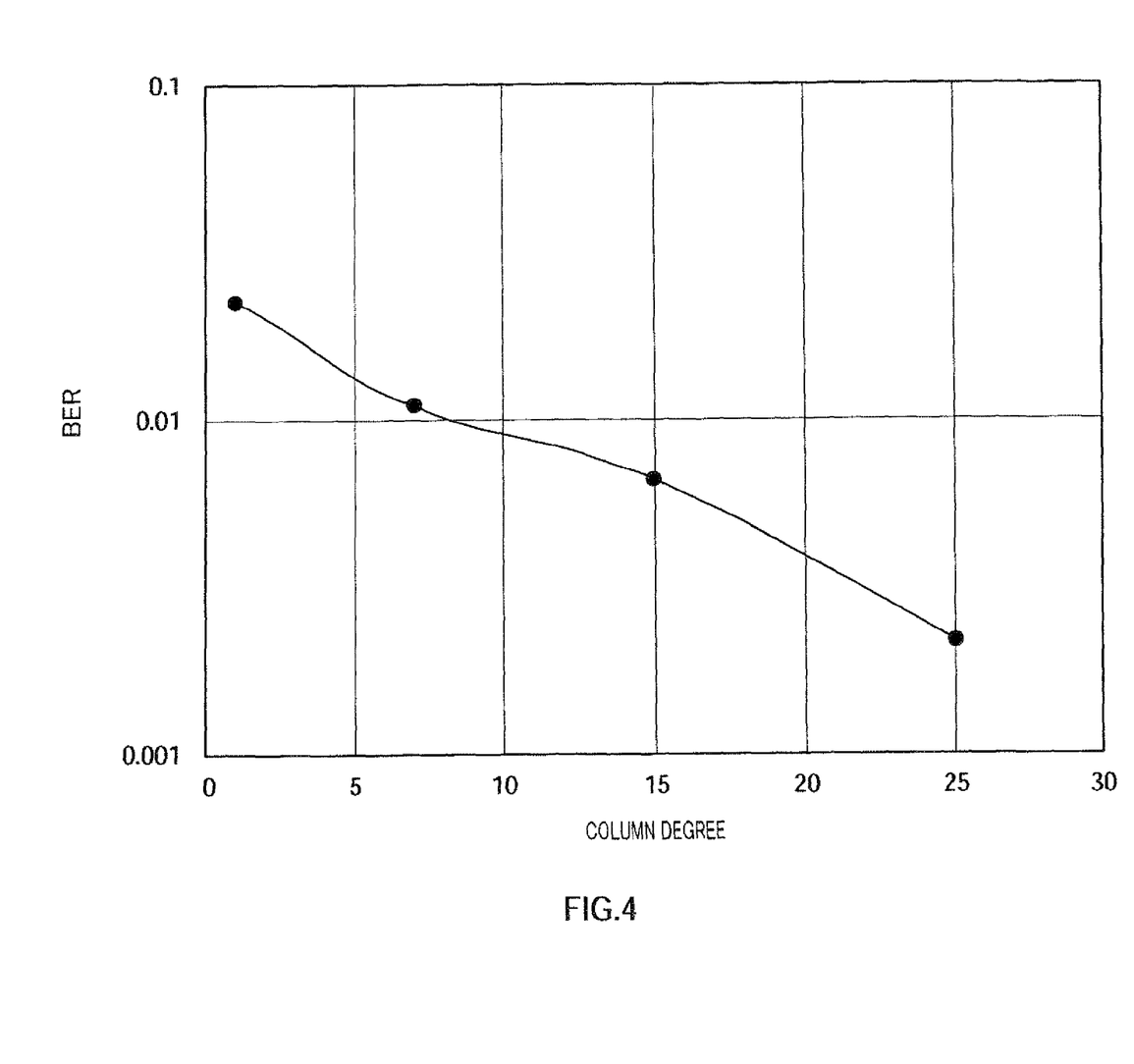
FIG. 4 illustrates a column degree BER (i.e., simulation result) according to an embodiment of the present invention.

Now, a simulation by the present inventors has made clear that bits of larger column degree obtain better BER (Bit Error Rate) performances with fewer errors. FIG. 4 shows the simulation result. The simulation result of FIG. 4 shows the BER to be associated with each column degree, where, in the LDPC code disclosed in above-noted Non-Patent Document 2, the transmission bit sequence length is 1044 bits, coding rate R is ⅓, evaluation $E_b/N_0$ is 0.5 dB, and the maximum number of iteration is 30.

This simulation result shows that a bit of a smaller column degree is more likely to have errors than a bit of a larger column degree. For example, when the parity check matrix shown in FIG. 2 is used, the fourth to sixth bits having a column degree of five are more likely to have errors than the first to third bits having column degree of eleven, nine and ten, respectively. Consequently, in the radio communication apparatus on the data receiving side, if the fourth to sixth bits have no errors, naturally, the first to third bits have no errors either. Therefore, in this case, in the radio communication apparatus on the data transmitting side, out of the first to sixth bits, CRC encoding needs to be performed targeting only the fourth to sixth bits.

Therefore, according to the distribution of column degree shown in FIG. 3, CRC encoding section 101 performs CRC encoding only with respect to bits having smaller column degree in the parity check matrix than a threshold in the inputted transmission bit sequence. To be more specific, CRC encoding section 101 performs the CRC encoding shown in FIG. 5, with the transmission bit sequence. In the following explanation, the transmission bit sequence length (i.e., code block size) is six bits for ease of explanation.

Figure 5:
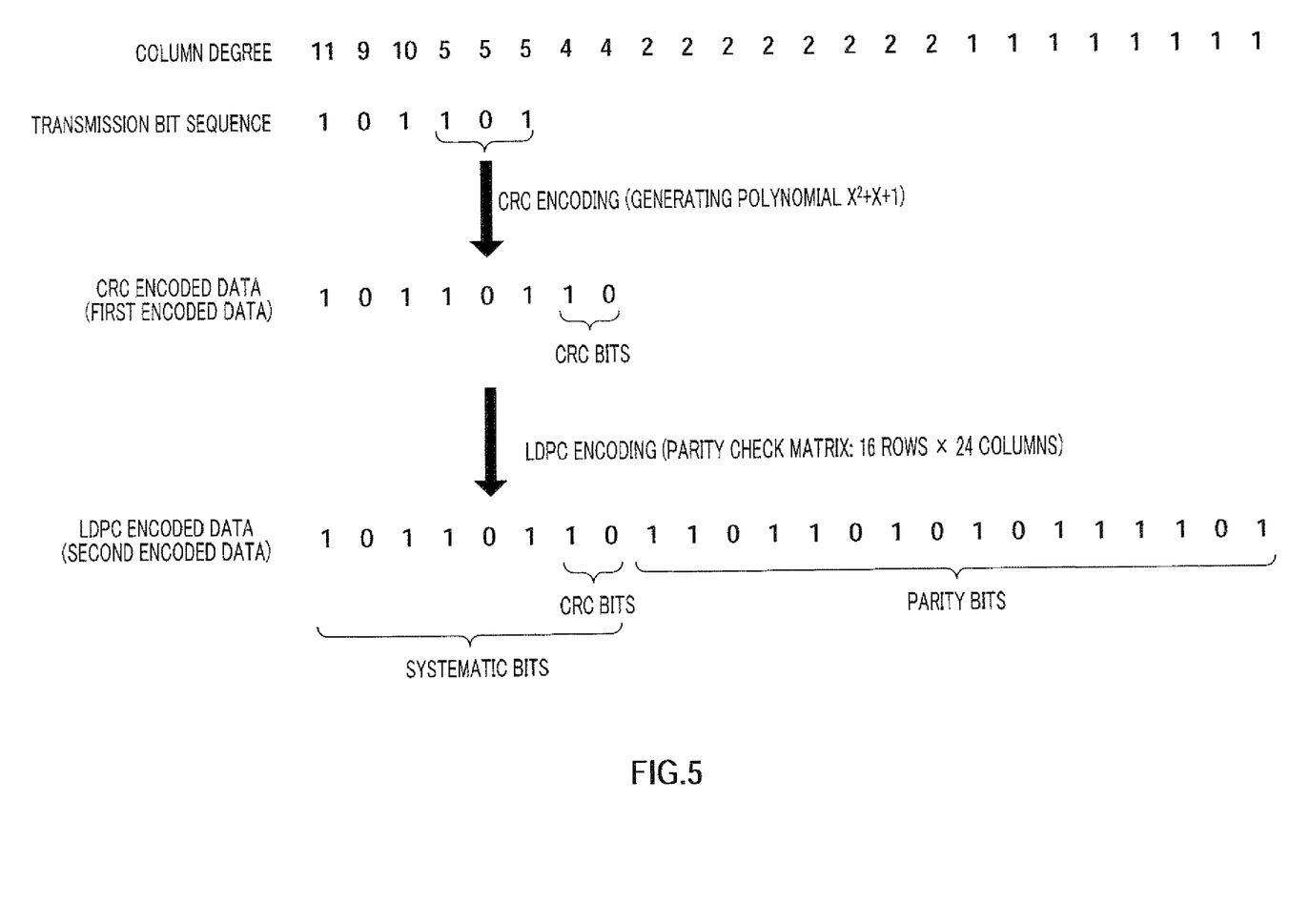
FIG. 5 illustrates encoding processing according to an embodiment of the present invention.

As shown in FIG. 5, when CRC encoding section 101 receives as input a transmission bit sequence "101101," CRC encoding section 101 performs CRC encoding for only the fourth to sixth bits "101" having smaller column degree in the parity check matrix (of FIG. 2) than a threshold of 8 in the transmission bit sequence "101101," and attaches CRC bits "10" for only the fourth to sixth bits "101," to the transmission bit sequence. Therefore, CRC encoded data (first encoded data) is "10110110."

Here, the threshold is calculated by $(C_{max}+C_{min})/2$ (truncating the numbers below the decimal point). $C_{max}$ and $C_{min}$ show the maximum value and minimum value of the column degree associated with the bits of the transmission bit sequence, respectively. Therefore, for example, if the transmission bit sequence is "101101" and the column degree associated with the bits are 11, 9, 10, 5, 5, 5, respectively, as shown in FIG. 5, $C_{max}$ is eleven and $C_{min}$ is five, and the threshold is eight.

Further, in the example shown in FIG. 5, $x^2+x+1$ is used as a generating polynomial in the CRC encoding.

Further, LDPC encoding section 102 performs LDPC encoding for the CRC encoded data "10110110" using the parity check matrix shown in FIG. 2, and acquires LDPC encoded data comprised of systematic bits and parity bits, or, to be more specific, acquires the LDPC encoded data (second encoded data) shown in FIG. 5.

As described above, according to the present embodiment, CRC bits are attached only to systematic bits and are not attached to parity bits, so that the radio communication apparatus on the data receiving side can perform an error detecting only with respect to the systematic bits after error correcting decoding. Therefore, in the situation where parity bits have error yet systematic bits have no errors, that is, in the situation where retransmissions are not necessary, it is possible to prevent a NACK from being reported to radio communication apparatus 100 on the transmitting side and extra retransmissions from occurring. Therefore, according to the present embodiment, it is possible to prevent reduction of throughput due to an occurrence of extra retransmission.

Further, according to the present embodiment, CRC encoding is performed targeting only part of the bits in a transmission bit sequence having smaller column degree in the parity check matrix, that is, targeting only bits that are likely to cause errors, so that it is possible to make the number of CRC bits less than a case where CRC encoding is performed targeting the whole transmission bit sequence. Therefore, according to the present embodiment, the overhead of CRC bits can be reduced, so that it is possible to minimize reduction of throughput caused by attaching CRC bits.

Further, bits having larger column degree are less likely to have error, and, consequently, as in the present embodiment, even if CRC encoding is performed targeting bits that are likely to have error according to the distribution of column degree in the parity check matrix, namely, according to the frequency of error occurrence, it is possible to perform an accurate error detecting without decreasing an error detecting rate.

Further, the parity check matrix shown in FIG. 2 is an example, and parity check matrixes that can be used in the present embodiment are not limited to the parity check matrix shown in FIG. 2.

Further, thresholds set in CRC encoding section 101 are not limited to the above-noted one, and, for example, it is equally possible to set the thresholds taking into account simulation results and such.

Figure 6:
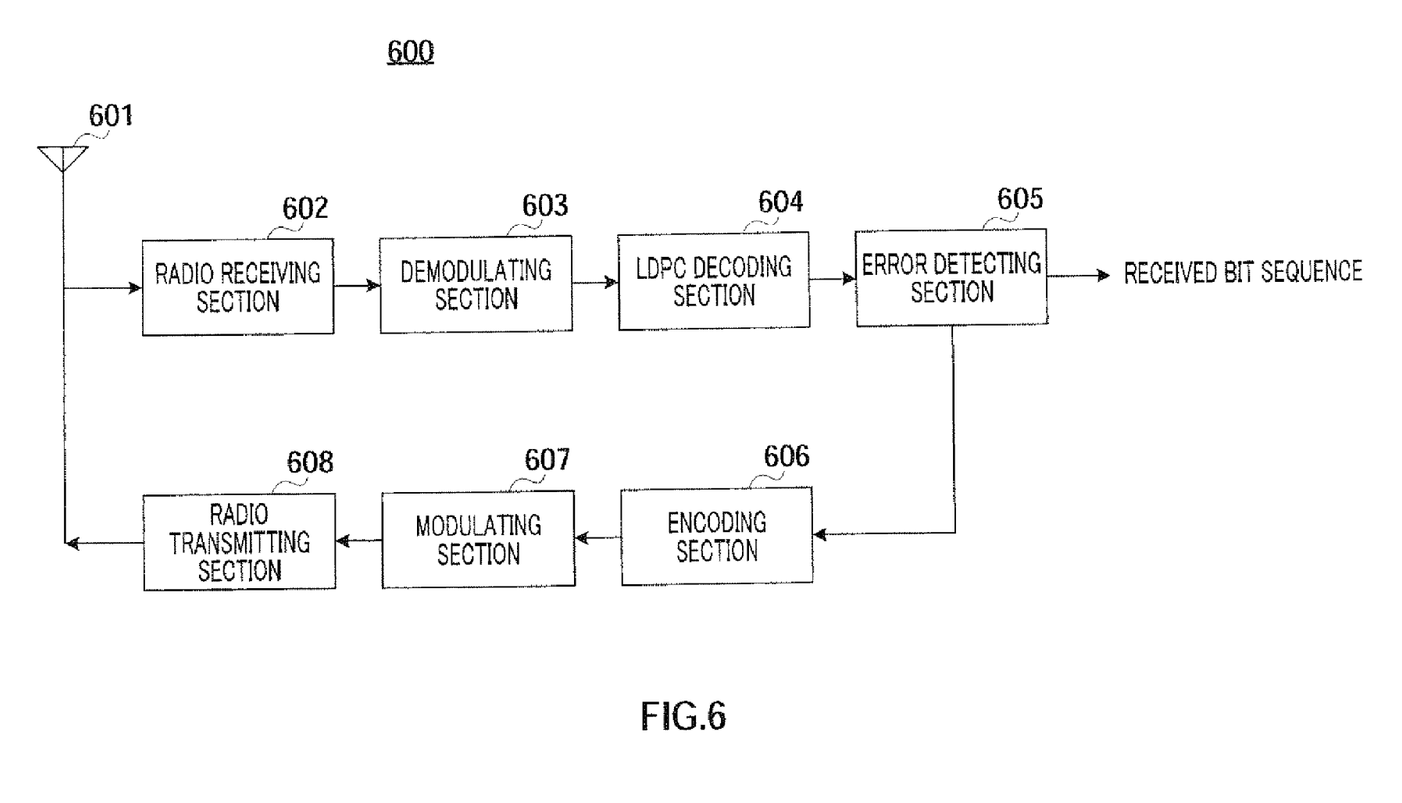
FIG. 6 is a block diagram showing the configuration of a radio communication apparatus on the data receiving side, according to an embodiment of the present invention.

Next, the radio communication apparatus on the data receiving side, according to the present embodiment will be explained. FIG. 6 illustrates the configuration of radio communication apparatus 600 on the data receiving side, according to the present embodiment.

In radio communication apparatus 600 on the data receiving side, radio receiving section 602 receives data symbols transmitted from radio communication apparatus 100 (shown in FIG. 1) on the data transmitting side via antenna 601, performs receiving processing such as down-conversion and A/D conversion on the radio data and outputs the result to demodulating section 603.

Demodulating section 603 demodulates the received data and outputs the result to LDPC decoding section 604.

LDPC decoding section 604 acquires a systematic bit sequence by performing LDPC decoding with respect to the received data using the same parity check matrix as the parity check matrix (shown in FIG. 2) used in LDPC encoding section 102 in radio communication apparatus 100 (shown in FIG. 1) on the data transmitting side. LDPC decoding section 604 performs iterative decoding according to LDPC decoding algorithms such as the sum-product decoding method and min-sum decoding method. The decoded systematic bit sequence subjected to a hard decision is outputted to error detecting section 605.

Figure 7:
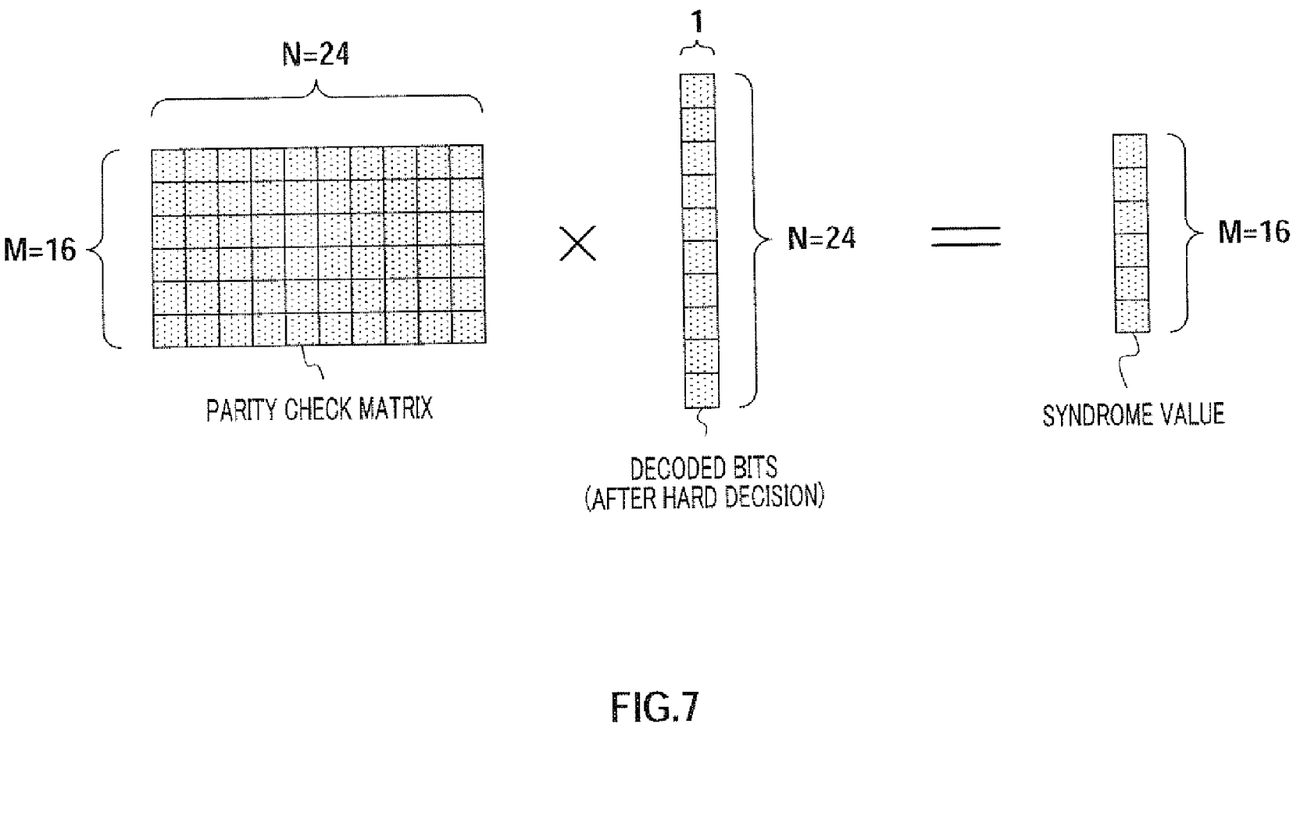
FIG. 7 illustrates a calculation method of a syndrome value according to an embodiment of the present invention.

Further, as shown in FIG. 7, LDPC decoding section 604 calculates syndrome values by a matrix calculation of multiplying the parity check matrix by a decoded bit sequence (comprised of systematic bits and parity bits) subjected to a hard decision, acquired every iteration of decoding. In this case, sixteen syndrome values are acquired. Further, LDPC decoding section 604 calculates the sum of these syndrome values and outputs the sum to error detecting section 605.

Further, LDPC decoding section 604 outputs column degree in the parity check matrix to error detecting section 605.

Error detecting section 605 performs error detecting with respect to the systematic bits by CRC. As a result of the error detecting, error detecting section 605 generates and outputs a NACK to encoding section 606 when the systematic bits have error, and generates and outputs an ACK to encoding section 606 when the systematic bits have no errors. Further, error detecting section 605 outputs the systematic bit sequence as a receiving bit sequence. Further, the error detecting processing in error detecting section 605 will be described later in detail.

Encoding section 606 encodes and outputs the ACK or NACK to modulating section 607.

Modulating section 607 generates a control signal by modulating the ACK or NACK, and outputs the result to radio transmitting section 608.

Radio transmitting section 608 performs transmission processing such as D/A conversion, amplification and up-conversion on the control signal, and transmits the result to from antenna 601 to radio communication apparatus 100 (shown in FIG. 1) on the data transmitting side.

Next, the error detecting processing in error detecting section 605 will be explained in detail.

A simulation by the present inventors has made clear that, when the sum of syndrome values is small, the phenomenon where parity bits have error yet systematic bits have no errors and the phenomenon where both parity bits and systematic bits have error occur together. Further, it has been made clear that a phenomenon is likely to occur where, when the sum of syndrome values becomes less, parity bits have error yet systematic bits have no errors. Further, it has been made clear that, when the sum of syndrome values becomes more, systematic bits are likely to have error.

Figure 8:
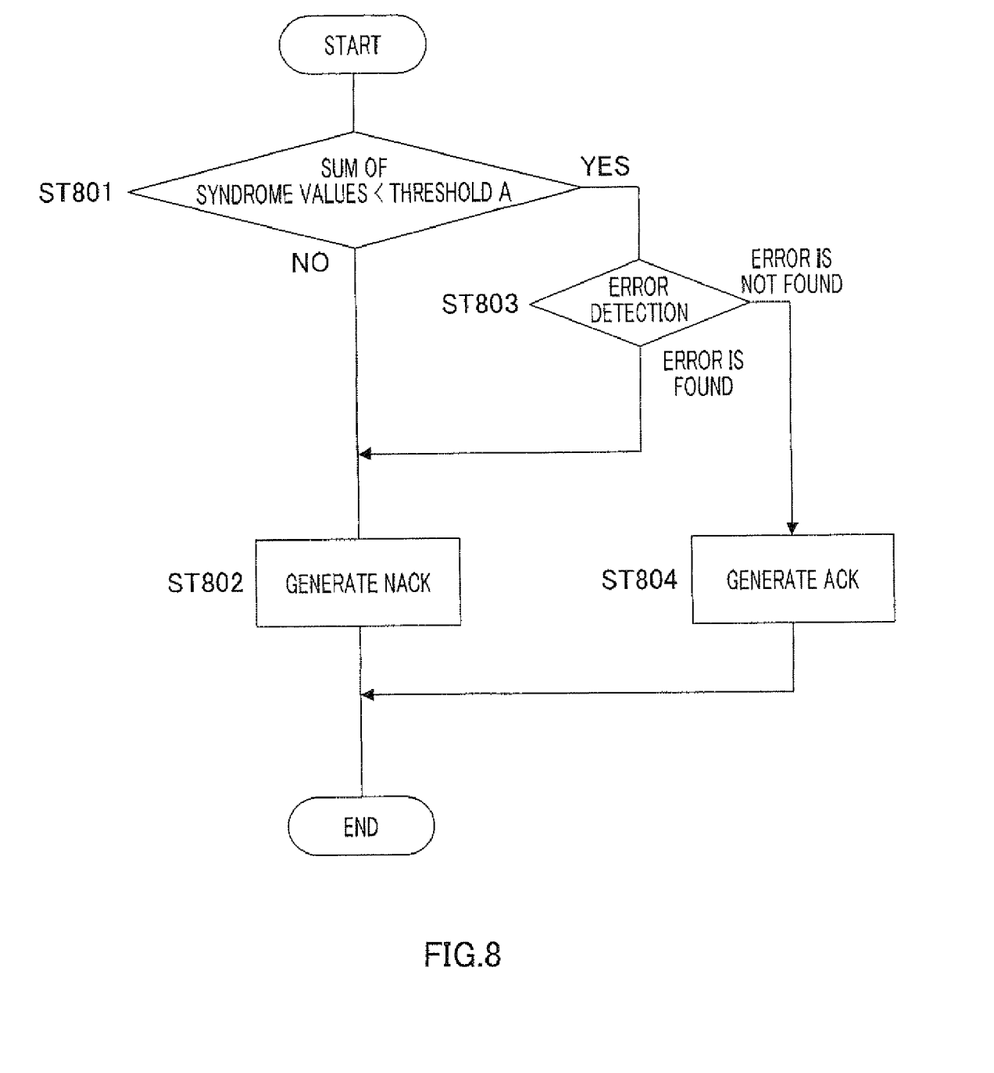
FIG. 8 is a flowchart showing detecting processing according to an embodiment of the present invention.

Therefore, error detecting section 605 performs error detecting processing according to the flowchart shown in FIG. 8.

First, in ST (step) 801, the sum of syndrome values and threshold A are compared. This threshold A is determined according to the systematic bit sequence length and is set a large value when the systematic bit sequence length is longer. For example, threshold A, given by multiplying the systematic bit sequence length by a predetermined value 0.025, may be set.

In ST 801, when the sum of syndrome values is equal to or greater than threshold A ("NO" in ST 801), the systematic bits are likely to have error, and, consequently, error detecting is not performed, and a NACK is generated in ST 802.

By contrast, when the sum of syndrome values is less than threshold A ("YES" in ST 801), the systematic bits may have error, and, consequently, error detecting by CRC is performed in ST 803. That is, only when the sum of the syndrome values is less than threshold A, error detecting is performed targeting the systematic bits. Further, in this case, error detecting is performed targeting only bits having smaller column degree in the parity check matrix than threshold B in the systematic bit sequence. This threshold B is preferably set the same value as the threshold set in CRC encoding section 101 in the radio communication apparatus (shown in FIG. 1) on the data receiving side.

Further, as the result of error detecting in ST 803, when error is found, a NACK is generated in ST 802, and, when error is not found, an ACK is generated in ST 804.

As described above, according to the present embodiment, error detecting by CRC is performed targeting only systematic bits in addition to LDPC decoding, so that it is possible to prevent the situation where parity bits have error yet systematic bits have no errors, that is, where a NACK is generated in the situation where retransmissions are not necessary. Therefore, it is possible to prevent reduction of throughput due to extra retransmissions.

Further, according to the present embodiment, in a case where the sum of syndrome values is large and systematic bits are certain to have error, a NACK is generated without even performing error detecting, so that it is possible to reduce processing time required for error detecting and reduce retransmission delay.

Further, according to the present embodiment, in a systematic bit sequence, error detecting is performed targeting only part of bits having smaller column degree in the parity check matrix, that is, error detecting is performed targeting only bits that are likely to have error, so that, compared to a case where error detecting is performed targeting the whole systematic bit sequence, it is possible to reduce processing time required for error detecting and reduce RTT (Round Trip Time) in ARQ.

Further, radio communication apparatus 600 on the data receiving side according to the present embodiment is applicable to a case where the radio communication apparatus on the data transmitting side performs CRC encoding targeting part of a transmission sequence, in addition to a case where CRC encoding is performed targeting only part of bits of the transmission bit sequence.

Further, although a case has been described with the above-noted explanation where the sum of syndrome values is calculated in LDPC decoding section 604, it is equally possible to find the sum of syndrome values in error detecting section 605 instead of LDPC decoding section 604. Further, thresholds A and B set by error detecting section 605 are not limited to the above, and it is equally possible to set thresholds taking into account a simulation result and such.

As described above, according to the present embodiment, when an LDPC code is used as an error correcting code, it is possible to suppress reduction of throughput and perform error detecting accurately.

The present embodiment of the present invention has been described above.

Further, although a case has been described with the above-noted embodiment where a CRC code is used as an error detecting code, a detecting code that can be used in the present invention is not limited to a CRC code.

Further, in mobile communication systems, it is possible to provide radio communication apparatus 100 (shown in FIG. 1) on the data transmitting side in a radio communication base station apparatus and provide radio communication apparatus 600 (shown in FIG. 6) on the data receiving side in a radio communication mobile station apparatus. Further, it is possible to provide radio communication apparatus 100 (shown in FIG. 1) on the data transmitting side in a radio communication mobile station apparatus and provide radio communication apparatus 600 (shown in FIG. 6) on the data receiving side in a radio communication base station apparatus. By this means, it is possible to provide a radio communication base station apparatus and radio communication mobile station apparatus having the same operational effect as above.

Further, a radio communication mobile station apparatus and a radio communication base station apparatus may be referred to as "UE" and "Node B," respectively.

Although a case has been described with the above embodiments as an example where the present invention is implemented with hardware, the present invention can be implemented with software.

Furthermore, each function block employed in the description of each of the aforementioned embodiments may typically be implemented as an LSI constituted by an integrated circuit. These may be individual chips or partially or totally contained on a single chip. "LSI" is adopted here but this may also be referred to as "IC," "system LSI," "super LSI," or "ultra LSI" depending on differing extents of integration.

Further, the method of circuit integration is not limited to LSI's, and implementation using dedicated circuitry or general purpose processors is also possible. After LSI manufacture, utilization of an FPGA (Field Programmable Gate Array) or a reconfigurable processor where connections and settings of circuit cells in an LSI can be reconfigured is also possible.

Further, if integrated circuit technology comes out to replace LSI's as a result of the advancement of semiconductor technology or a derivative other technology, it is naturally also possible to carry out function block integration using this technology. Application of biotechnology is also possible.

The disclosure of Japanese Patent Application No. 2006-229810, filed on Aug. 25, 2006, including the specification, drawings and abstract, is incorporated herein by reference in its entirety.

INDUSTRIAL APPLICABILITY

The present invention is applicable to mobile communication systems or the like.

The invention claimed is:

1. A radio communication apparatus on a transmitting side, comprising:
a first encoding section that receives a transmission bit sequence, and acquires first encoded data by performing error detecting encoding only with respect to bits having a smaller column degree in a parity check matrix for low density parity check encoding than a threshold out of the transmission bit sequence;
a second encoding section that acquires second encoded data by performing the low density parity check encoding using the parity check matrix with respect to the acquired first encoded data; and
a transmitting section that transmits the acquired second encoded data.

2. The radio communication apparatus according to claim 1, wherein the first encoding section performs the error detecting encoding by attaching cyclic redundancy check bits for only the bits having the smaller column degree than the threshold, to the transmission bit sequence.

3. A radio communication apparatus on a receiving side, comprising:
a decoding section that receives an encoded bit sequence, acquires a decoded bit sequence by performing low density parity check decoding with respect to the received encoded bit sequence, and calculates syndrome values from the decoded bit sequence and a parity check matrix for the low density parity check decoding; and an error detecting section that performs error detecting with respect to systematic bits having a smaller column degree in the parity check matrix than a first threshold out of the acquired decoded bit sequence, only when a sum of the syndrome values is less than a second threshold different from the first threshold.

4. A radio communication base station apparatus comprising the radio communication apparatus according to claim 1.

5. A radio communication mobile station apparatus comprising the radio communication apparatus according to claim 1.

6. A radio communication base station apparatus comprising the radio communication apparatus according to claim 3.

7. A radio communication mobile station apparatus comprising the radio communication apparatus according to claim 3.

8. An error detecting encoding method for a transmission bit sequence subject to low density parity check encoding, comprising:

performing error detecting encoding only with respect to bits having a smaller column degree in a parity check matrix for the low density parity check encoding than a threshold out of the transmission bit sequence, to acquire first encoded data;

performing the low density parity check encoding using the parity check matrix with respect to the acquired first encoded data, to acquire second encoded data; and transmitting the acquired second encoded data.

9. The radio communication apparatus on the transmitting side according to claim 1, wherein the threshold is calculated based on a maximum value and a minimum value of a column degree associated with the bits of the transmission bit sequence.

10. The radio communication apparatus on the receiving side according to claim 3, wherein the first threshold is calculated based on a maximum value and a minimum value of a column degree associated with the bits of the transmission bit sequence.

11. The radio communication apparatus on the receiving side according to claim 3, wherein the second threshold is determined according to a systematic bit sequence length.

12. A method for error detecting performed by a radio communication apparatus on a receiving side, comprising:

acquiring a decoded bit sequence by performing low density parity check decoding with respect to an encoded bit sequence;

calculating syndrome values from the acquired decoded bit sequence and a parity check matrix for the low density parity check decoding; and performing the error detecting with respect to a systematic bit having a smaller column degree in the parity check matrix than a first threshold out of the acquired decoded bit sequence, only when a sum of the syndrome values is less than a second threshold different from the first threshold.

* * * * *

UNITED STATES PATENT AND TRADEMARK OFFICE
CERTIFICATE OF CORRECTION

PATENT NO. : 8,225,169 B2
APPLICATION NO. : 12/438679
DATED : July 17, 2012
INVENTOR(S) : Kenichi Kuri et al.

It is certified that error appears in the above-identified patent and that said Letters Patent is hereby corrected as shown below:

In the Claims

Claim 1, column 8, line 54 incorrectly reads:

"ing using the parity cheek matrix with respect to the"

and should read:

"ing using the parity check matrix with respect to the".

Signed and Sealed this
Twenty-fifth Day of June, 2013

Teresa Stanek Rea
*Acting Director of the United States Patent and Trademark Office*